United States Patent [19]
Kappes et al.

[11] Patent Number: 6,144,092
[45] Date of Patent: Nov. 7, 2000

[54] ELECTRONIC POWER DEVICE HEATSINK CLAMPING SYSTEM

[75] Inventors: Christopher Max Kappes, Kokomo, Ind.; James William Salley, Beavercreek, Ohio

[73] Assignee: Delco Electronics Corp., Kokomo, Ind.

[21] Appl. No.: 09/017,643

[22] Filed: Feb. 2, 1998

[51] Int. Cl.[7] ................................................. H01L 23/34

[52] U.S. Cl. ........................ 257/718; 257/718; 257/719; 257/712; 361/726; 361/702; 361/703; 361/704; 361/709

[58] Field of Search .................................. 257/718, 719, 257/712; 361/726, 702, 703, 704, 709

[56] References Cited

U.S. PATENT DOCUMENTS

| | | | |
|---|---|---|---|
| 4,872,089 | 10/1989 | Ocken et al. | 361/388 |
| 4,972,294 | 11/1990 | Moses, Jr. et al. | 361/386 |
| 5,309,979 | 5/1994 | Brauer | 165/80.2 |

*Primary Examiner*—Mahshid Saadat
*Assistant Examiner*—Matthew E. Warren
*Attorney, Agent, or Firm*—Jimmy L. Funke

[57] ABSTRACT

In a preferred embodiment, an electronic power device heatsink clamping system, including: a heatsink; at least one electronic power device disposed adjacent a side of the heatsink; at least one clamping spring, having first and second ends, disposed so as to press the at least one electronic device against the side of the heatsink; and a pressure enhancing member pressing against the at least one clamping spring, intermediate the first and second ends, causing the clamping spring to act as a simple beam spring.

5 Claims, 4 Drawing Sheets

ELECTRONIC POWER DEVICE HEATSINK CLAMPING SYSTEM

BACKGROUND OF THE INVENTION

1. Field of the Invention

The present invention relates to generally and, more particularly, but not by way of limitation, to heatsink power devices generally and more particularly to a novel electronic power device heatsink clamping system that improves heat transfer from an electronic power device to a heatsink.

2. Background Art

Heatsinks are widely used to transfer heat from heat producing electronic devices to the surrounding atmosphere. This cools the electronic devices, prolonging the lives thereof and improving performance. Similarly, other electronic devices in proximity to the heat producing electronic devices are protected as well.

A common technique in the use of such heatsinks is to provide spring clamping members to clamp the heat producing electronic devices against the heatsinks. Known such clamping members are of the cantilever spring type having an anchored end and a free end, the free end typically bearing against an electronic device to force the electronic device into close engagement with the heatsink. Although such an arrangement provides for good heat transfer between the components, a higher rate of heat transfer would provide a concomitant improvement in heat transfer and, therefore, component cooling.

Accordingly, it is a principal object of the present invention to provide a heatsink clamping system that improves heat transfer between a heat producing electronic component and a heatsink.

It is a further object of the invention to provide such a heatsink clamping system that provides for simplified manufacturing.

It is an additional object of the invention to provide such a heatsink clamping system that is economically manufactured using conventional techniques.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, an electronic power device heatsink clamping system, comprising: a heatsink; at least one electronic power device disposed adjacent a side of said heatsink; at least one clamping spring, having first and second ends, disposed so as to press said at least one electronic device against said side of said heatsink; and a pressure enhancing member pressing against said at least one clamping spring, intermediate said first and second ends, causing said clamping spring to act as a simple beam spring.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
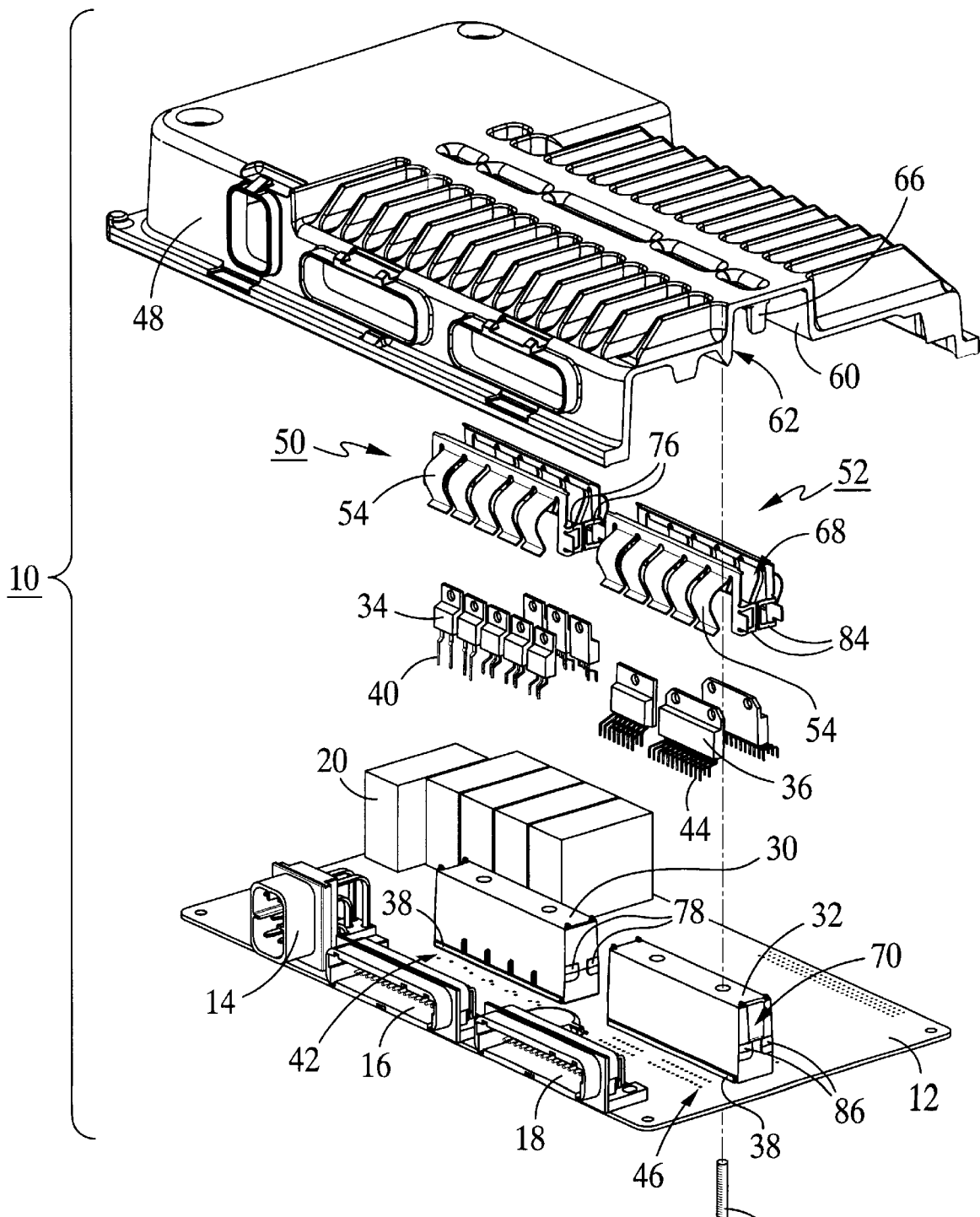
FIG. 1 is an exploded isometric view of a heatsink clamping system according to the present invention.
Figure 2:
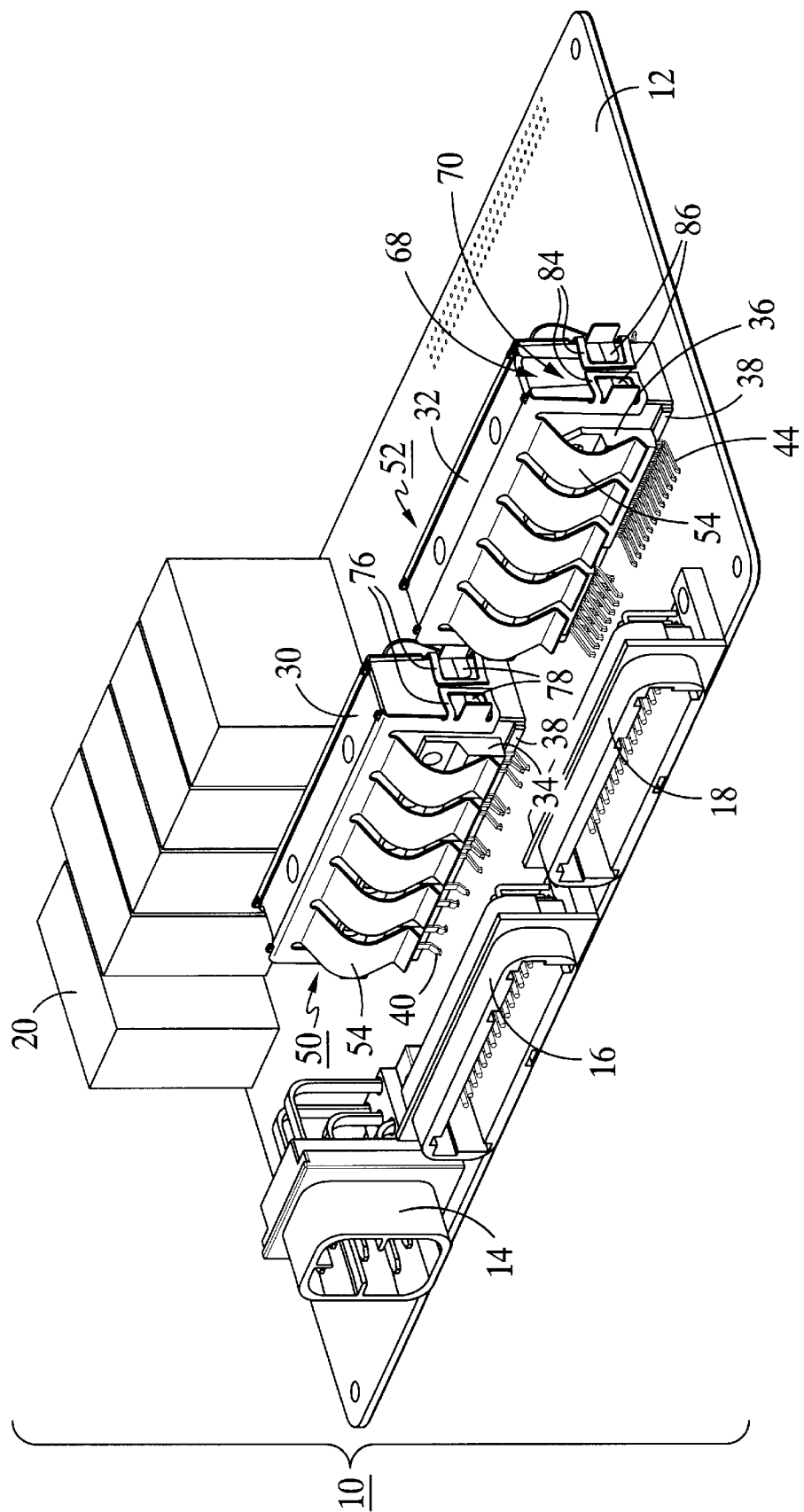
FIG. 2 is an isometric view of the heatsink clamping system, with the cover thereof removed.

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other views.

Referring to FIG. 1, there is illustrated a printed circuit board assembly, generally indicated by the reference numeral 10 and including components of the electronic power device heatsink clamping system constructed according to the present invention. Printed circuit board assembly includes a circuit board 12 which has mounted on the upper surface thereof conventional connectors 14, 16, and 18 and other, unspecified, conventional electronic components, as at 20. It will be understood that connectors 14, 16, and 18 and electronic components 20 have electrical connection members extending through circuit board 12 for connection to printed circuitry disposed on the lower surface of the circuit board (non shown).

Also mounted on the upper surface of circuit board 12 are first and second heatsinks 30 and 32, the heatsinks having no electrical connection members extending through the circuit board. Disposed for mounting against the side surfaces of heatsinks 30 and 32, respectively, are a first group of heat producing electronic devices, such as device 34, and a second group of heat producing electronic devices, such as device 36. Each device 34 has at least one lead 40 depending therefrom for insertion through a corresponding aperture 42 defined through circuit board 12 for connection to the aforementioned printed circuitry disposed on the lower surface of the circuit board. Similarly, each device 36 has at least one lead 44 depending therefrom for insertion through a corresponding aperture 46 defined through circuit board 12 for the same purpose.

Disposed above circuit board 12 for insertion over heatsinks 30 and 32 and heat producing devices 34 and 36 are, respectively, spring clamping members generally indicated by the reference numerals 50 and 52 each having lateral rows of individual, generally arcuate, clamping springs, as at 54, extending generally outwardly and downwardly from upper portions of the clamping members. It will be understood that, in the case of heatsink 30 and heat producing devices 34, one clamping spring 54 will engage one heat producing device 34, as shown, while, in the case of heatsink 32 and heat producing devices 36, two or three clamping springs 54 will engage a heat producing device 36, as shown. Other, similar arrangements may be provided as well. Each heatsink 30 and 32 has a ledge 38 formed along the lower edges of the sidewalls thereof.

Disposed above circuit board 12 for insertion thereover is a cover member 48, the cover member including internal, generally parallel and vertical sidewalls 60 and 62 extending at least the overall length of spring clamping members 30 and 32. Cover member 48 also includes a locating post 66 which, when cover member 48 is inserted over spring clamping members 30 and 32 and heatsinks, will engage a locator slot 70 defined in the proximal end of heatsink 32, the locator slot assisting in guiding the cover into place and serving to maintain the cover in proper relationship to the other components when assembled. A similar locator post (not shown) will engage locator slots formed in the distal end of heatsink 30 for the same purposes.

A pair of snap tabs 76 formed on the proximal end of spring clamping member 50 engage a pair of bosses 78 formed on the proximal end of heatsink 30 to secure the spring clamping member on the heatsink. Similarly, there are provided a pair of snap tabs 84 formed on the proximal end of spring clamping member 52 and a pair of bosses 86 formed on the proximal end of heatsink 32 for the same purpose. It will be understood that similar pairs of snap tabs and receiving tabs (non shown) will be formed on the distal ends of the foregoing heatsinks and clamping members for the same purpose.

Inside portions of cover member 48 are held tightly against the upper surfaces of heatsinks 30 and 32 by means of threaded screws 90 (only one shown) passing from below the lower surface of circuit board 12 through the heatsinks and into cover member 48.

Figure 3:
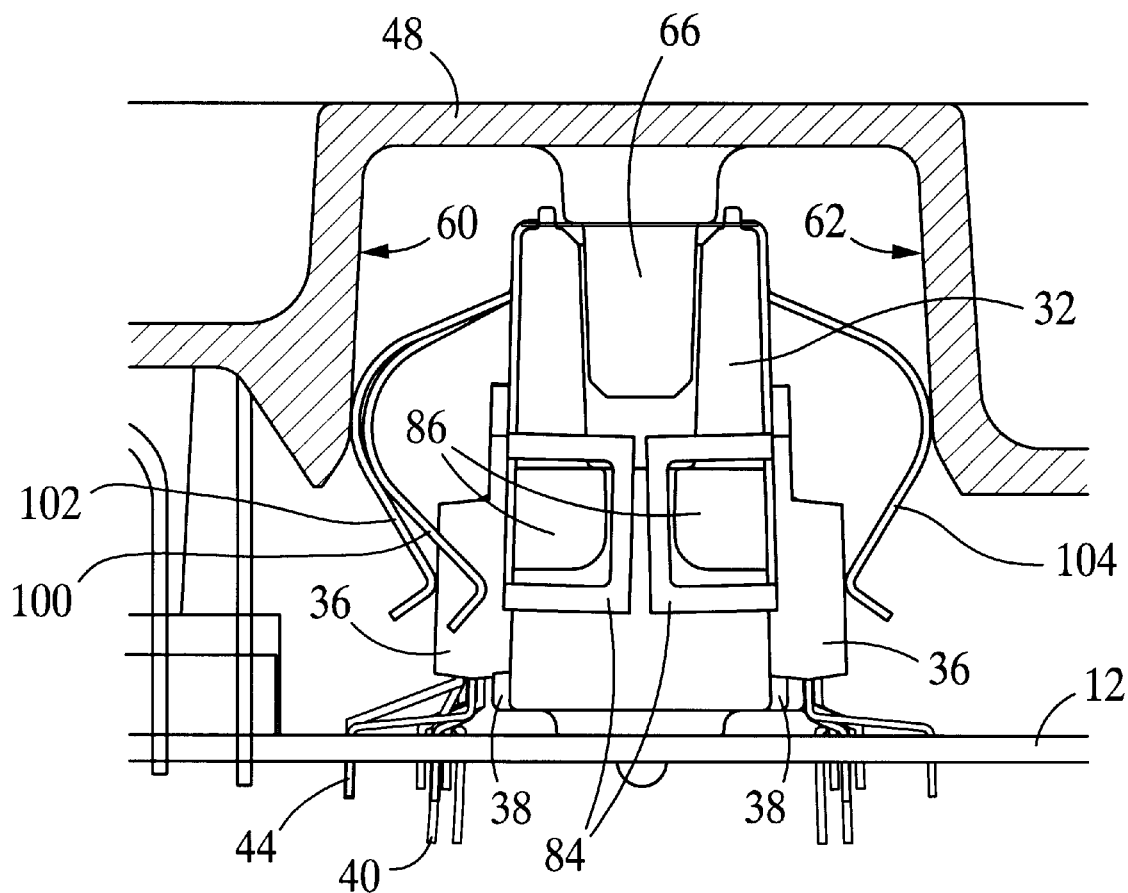
FIG. 3 is a end elevational view, partially schematic, of the heatsink clamping system.

FIG. 3 illustrates more clearly the unique clamping feature of the system of the present invention. Here, reference numeral 100 indicates a clamping spring as it would appear without heat producing device 36 and cover member 48 in place. Reference numeral 102 indicates a clamping spring as it would appear with heat producing device 36 in place, but without cover member 48 in place. Reference numeral 104 indicates a clamping spring with both heat producing device 36 and cover member 48 in place. It can be seen that surface 62 of cover member 48 engages clamping spring 104 at a place intermediate the ends of the clamping spring, providing further clamping force between heat producing device 36 and heatsink 32.

In the manufacturing process, heatsinks are mounted on the upper surface of circuit board 12 (FIG. 3) and heat producing devices 34 and 36 are placed on ledges 38. Then spring clamping members 50 and 52 are snapped into place, respectively, over heatsinks 30 and 32, thus providing a low level of pressure to hold heat producing devices 34 and 36 in place for wave soldering. Circuit board 12 is then inverted and pressed into die cast cover member 48 using a pneumatic press fixture, thus providing the final clamping force as indicated on FIG. 3.

It has been found the construction of the present invention provides superior heat transfer from heat producing devices 34 and 36 to heatsinks 30 and 32. The intimate engagement of the upper surfaces of heatsinks 30 and 32 with portions of the inner surface of cover member 48 enhances heat transfer from the heatsinks to the cover and thence to the surrounding environment.

Figure 4A:
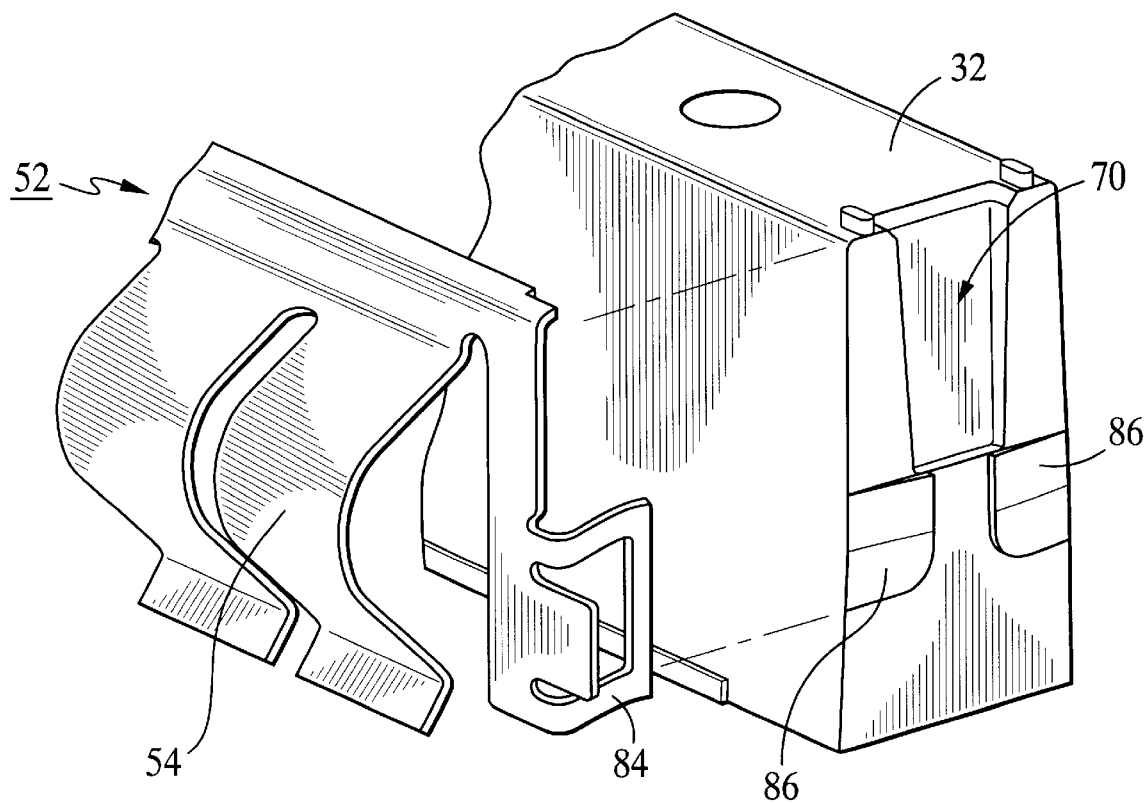
FIGS. 4A and 4B are fragmentary details showing the engagement of locating and securing members of the heatsink clamping system.
Figure 4B:
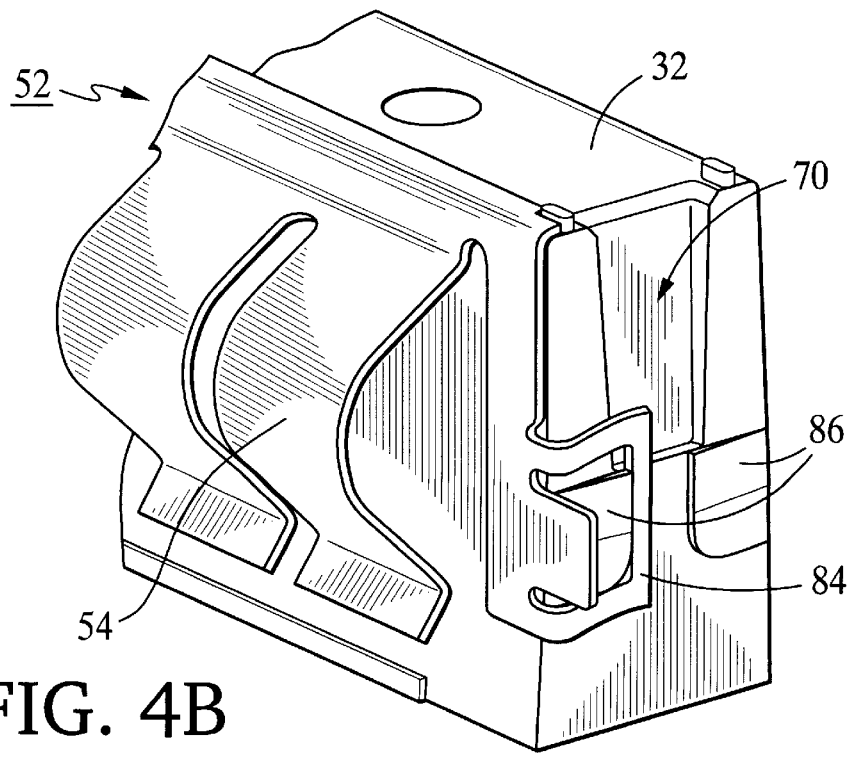

FIGS. 4A and 4B illustrate more clearly how snap tabs 84 engage bosses 86 formed on the proximal end of heatsink 32. As spring clamping member 52 is inserted in place over heatsink 32, snap tab 84 elastically deforms slightly as it is placed over boss 86. Then, when snap tab 84 is in place, it returns to its relaxed state as it snaps around boss 86.

It will be understood that the present invention is applicable as well to arrangements having only one or more than two of heatsinks 30 and 32.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

We claim:

1. An electronic power device heatsink clamping system, comprising:

(a) a heatsink;

(b) at least one electronic power device disposed adjacent a side of said heatsink;

(c) at least one clamping spring, having first and second ends, with said first end fixedly mounted with respect to said heatsink and a portion of said second end disposed so as to press said at least one electronic device against said side of said heatsink;

(d) a pressure enhancing member pressing against said at least one clamping spring, intermediate said first end and said portion of said second end, causing said clamping spring to act as a simple beam spring, with said portion of said second end pressing said at least one electronic device against said side of said heatsink; and (e) said portion of said second end being a sole element providing contact between said electronic power device and said heatsink.

2. An electronic power device heatsink clamping system, as defined in claim 1, wherein:

(a) said first end of said at least one clamping spring is attached to at least one spring clamping member and said second end of said at least one clamping spring engages said at least one electronic power device;

(b) said at least one clamping spring has a generally arcuate portion extending from said first end thereof; and (c) said pressure enhancing member presses against said generally arcuate portion of said at least one clamping spring.

3. An electronic power device heatsink clamping system, as defined in claim 2, wherein: said pressure enhancing member is an internal wall of a cover disposed over said at least one spring clamping member and said at least one heatsink.

4. An electronic power device heatsink clamping system, as defined in claim 3, further comprising: at least one locating post defined in said cover, said at least one locating post engaging a locating slot defined in said at least one heatsink to aid in inserting said cover over said at least one clamping spring member and said at least one heatsink and to maintain proper relative orientation of said cover, said at least one clamping spring member, and said at least one heatsink.

5. An electronic power device heatsink clamping system as defined in claim 3, further comprising: at least one pair of snap tabs defined in said at least one clamping spring member to engage corresponding bosses defined on said at least one heatsink to aid in securing said at least one clamping spring member to said at least one heatsink.

* * * * *